US005862071A

United States Patent [19]

Scholder

[11] Patent Number: 5,862,071

[45] Date of Patent: Jan. 19, 1999

[54] RECEPTACLE FOR TOUCH MEMORY BUTTON

[75] Inventor: Erica Scholder, Austin, Tex.

[73] Assignee: Dell USA, L.P., Austin, Tex.

[21] Appl. No.: 644,210

[22] Filed: May 10, 1996

[51] Int. Cl.[6] .......... G11C 13/00

[52] U.S. Cl. .......... 365/52; 365/63

[58] Field of Search .......... 365/52, 189.01, 365/230.01, 63, 244

[56] References Cited

U.S. PATENT DOCUMENTS 5,079,741 1/1992 Kimura .......... 365/52

OTHER PUBLICATIONS

Dallas Semiconductor, *50 Ways To Touch Memory*, Third Edition.

*Primary Examiner*—Terrell W. Fears

*Attorney, Agent, or Firm*—Haynes and Boone, L.L.P.

[57] ABSTRACT

A receptacle for completing an electrical circuit between first and second devices, such as an electronic button and an interface circuit. The receptacle comprises a column moveable within a structure defining a channel having first and second ends, the column includes an electrically conductive contact engageable by the first device at the first channel end. An electrical terminal is spaced from the column at a second channel end, the electrical terminal being electrically connectable to the second device. A connector is electrically connected to the contact and extends within the channel toward the terminal, such that upon engagement of the contact by the first device, the connector electrically engages the terminal, thereby completing the electrical circuit between the devices. A second electrically conductive contact is located within the channel adjacent the column which is engageable by the first device. A second terminal is spaced from the column at the second channel end, the second terminal being electrically connectable to the second device and also being connectable to the second electrically conductive contact by a ground spring arrangement.

24 Claims, 4 Drawing Sheets

RECEPTACLE FOR TOUCH MEMORY BUTTON

TECHNICAL FIELD

The invention relates generally to electronic receptacles and more specifically to a receptacle in an electronic enclosure for use with an electronic button.

BACKGROUND OF THE INVENTION

Dallas Semiconductor Corporation of Dallas, Tex. has created a series of electronic buttons which are marketed under the trademark "Touch Memory™." These electronic buttons consist of a semiconductor chip secured within a coin-shaped stainless steel container which is approximately 16.3 millimeters in diameter and 5.8 millimeters thick, similar in appearance to a large watch battery. Just like a watch battery, these electronic buttons are circular in shape and constructed with joined circular female and male members. The female member comprises one surface of the container and its sides, while the male member is designed to be inserted into the female member to comprise the second surface of the container. The electronic button is assembled such that the female and male members are electrically insulted from one another, thus enabling the female and male members to serve as separate electrical terminals when the electronic button is in use, similar to the positive and negative terminals of a watch battery.

When the electronic button is assembled, a semiconductor chip having a ground and a signal pin is secured within the container. The semiconductor chip's ground pin is electrically connected to the female member and the semiconductor chip's signal pin is electrically connected to the male member. This allows the female member to serve as the ground terminal and the male member to serve as the signal terminal for the encased semiconductor chip.

The electronic button's internal semiconductor chip is uniquely designed such that by attaching the electronic button ground terminal to ground and simultaneously attaching the signal terminal to an appropriately activated electrical signal, the electronic button is able to deliver data stored in the semiconductor chip onto the signal line and/or receive data sent on the signal line. One of the unique features of the electronic button is that data may be delivered and/or received in a very brief period of time, thus only requiring a momentary contact with the ground and signal terminals. In one application, a "read-only" electronic button can be programmed with a unique identification number which enables the electronic button to serve as an electronic key. In another application a "read/write" electronic button may be used to record and keep track of a patient's medical data which may be placed on a bracelet and worn by the patient during the patient's hospital stay. The internal semiconductor chip may be designed with various other functionalities and used in many applications.

One of the problems encountered with the use of electronic buttons is the design of an acceptable receptacle to receive the electronic button. The receptacle, upon receipt of the button, makes the appropriate ground and signal contacts with a device to which the button interfaces, such that data and/or signals may be transferred between the interface device and the button's internal semiconductor chip. Various receptacles are available that utilize a circular electronic button retainer, hardwired to the interface device and having an outer ground contact and an inner signal contact into which the electronic button is inserted. Once inserted, the ground and signal contacts complete an electrical circuit through the electronic button to activate its internal semiconductor chip and the transfer of data to or from the interface device.

While the foregoing receptacle design is suitable for most applications, drawbacks exist when the design is employed in connection with certain types of electronic enclosures. For example, the ground and signal contacts of the receptacle, when not in operation with the electronic button, often remain exposed on the face of the enclosure thereby creating a potential for short circuit activation and/or damage to the interface device connected to the receptacle. Further, the single-piece construction of the receptacle, and the hard-wired electrical connections between the receptacle and the interface device, make it difficult to incorporate the receptacle into an electronic enclosure that has a removable cover. In particular, upon removal of the cover to which the receptacle is mounted, the electrical wiring extending between the receptacle and the interface device must be disconnected, or alternatively the wiring must be of sufficient length to avoid inadvertent disconnection.

The above problems associated with existing electronic button receptacles are of particular concern when the electronic enclosure involved is the housing of a personal computer. Generally, electronic buttons are used with personal computers as an electronic key for verifying access to the system and for other intelligent data transfer operations. The receptacle of the electronic button is typically incorporated into the front bezel, i.e, the removable cover, of the computer housing. The receptacle is then connected by wiring to interface circuitry within the computer to enable data communication between the electronic button and the computer. Since most personal computers reside on a desktop surface, there is an increased risk of conductive material, e.g., pens, paper clips and the like, accidentally short-circuiting the contacts of the receptacle and thus causing damage to the interface circuitry inside the computer. Also, removal of the computer's cover is often necessary to access memory cards, peripheral cards and other parts of the computer. The electronic receptacle is traditionally mounted on the cover and a fly-wire connects the receptacle to the interface circuitry within the computer. The fly-wire enables partial removal of the cover from the computer housing without disconnection of the receptacle. However, the fly-wire can be easily severed and tethering the receptacle to the computer in this fashion is both unwieldy and inconvenient.

Consequently, there is a need for an apparatus that protects the ground and signal contacts of an electronic button receptacle from being inadvertently short-circuited by contact with foreign objects.

There is a further need for an apparatus that permits an electronic receptacle to be mounted on a removable cover, e.g., bezel, of an electronic housing without requiring a wired electrical connection between the receptacle and interface circuitry of the housing, thereby facilitating removal and replacement of the cover relative to the housing.

SUMMARY OF THE INVENTION

The present invention, accordingly, provides an apparatus for mounting an electronic button receptacle to a removable cover of an electronic housing that overcomes or reduces disadvantages and limitations associated with prior electronic button receptacle systems.

The electronic button receptacle comprises a column moveable within a structure defining a channel having first and second ends, the column includes an electrically conductive contact engageable by a first device at the first channel end. An electrical terminal is spaced from the column at a second channel end, the electrical terminal being electrically connectable to the second device. A connector is electrically connected to the contact and extends within the channel toward the terminal, such that upon engagement of the contact by the first device, the connector electrically engages the terminal, thereby completing the electrical circuit between the devices.

A second electrically conductive contact may be located within the channel adjacent the column which is engageable by the first device. A second terminal is spaced from the column at the second channel end, the second terminal being electrically connectable to the second device and also being connectable to the second electrically conductive contact by ground spring means.

In another embodiment a housing is used which has cooperating first and second components, the first component having a channel defined therein. A column is moveable within the channel and the column has a first engageable electrically conductive contact. A first electrical pad is secured to the second component proximate the channel, and a first electrical connector electrically connected to the first contact extends within the channel toward the pad, wherein upon engagement of the column, the connector electrically engages the pad.

The invention results in several technical advantages. Generally, the first contact does not connect to an electrical signal until the column has been moved within the channel, minimizing the risk of inadvertent short circuits. Further, by using electrical connectors to connect the contacts to their associated electrical pads allows the first and second components of the housing to be easily removed.

DESCRIPTION OF THE PREFERRED EMBODIMENT

Figure 1B:
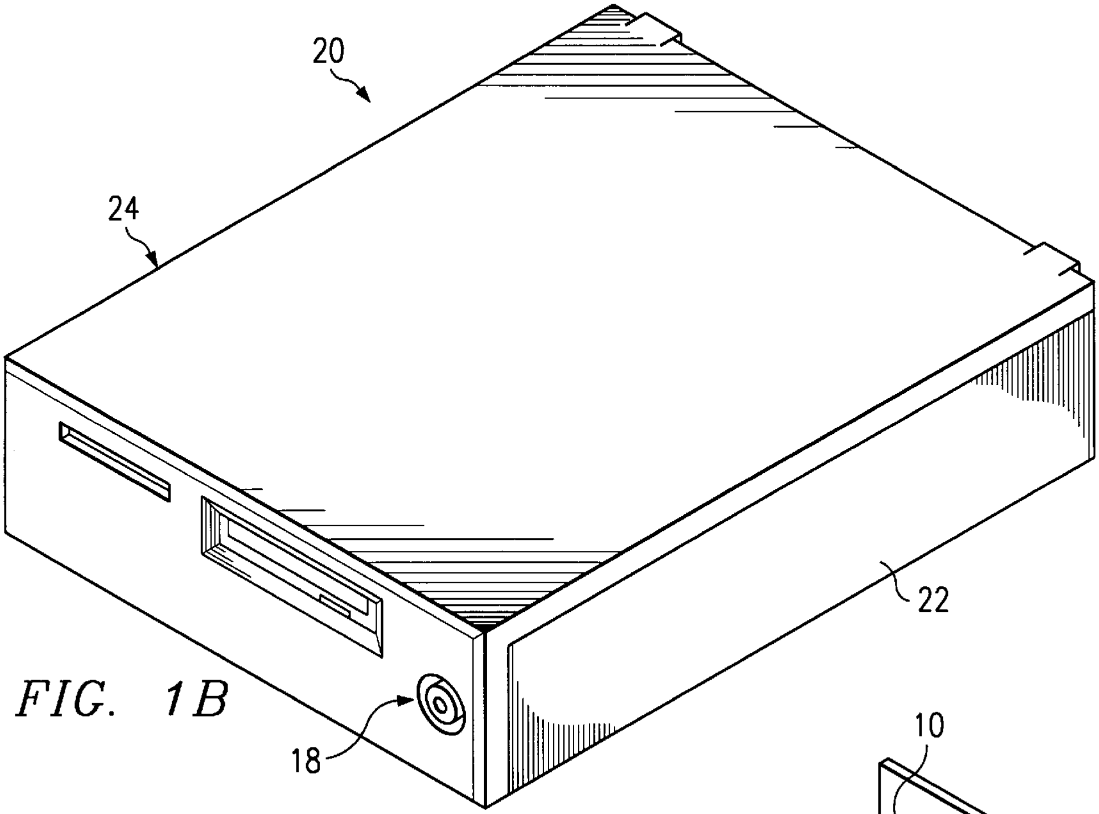
FIG. 1B is a perspective view of a computer housing with an electronic button receptacle of the present invention mounted within the front bezel of the housing.
Figure 1A:
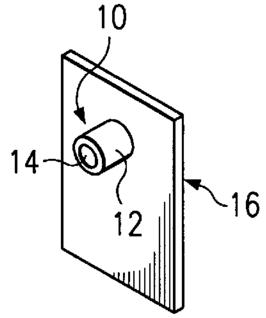
FIG. 1A is a perspective view of an electronic button secured to a substrate such as an employee badge.

In FIG. 1A the reference numeral 10 refers to an electronic button. The button 10 comprises a cylindrical metal container having interfitting "female" and "male" members 12 and 14, respectively. The female member 12 operates as an electrical ground terminal and the male member 14 operates as an electrical signal terminal for a semiconductor chip (not shown), located within the button 10. As explained below, the semiconductor chip in the button 10 is used for sending data to, or receiving data from, some type of interface circuitry (not shown). For convenience, the button 10 is secured to a substrate 16, such as an employee badge, ring, key chain or the like.

Referring also to FIG. 1B, the button 10 is designed to engage a receptacle 18 electrically connected to an interface circuit (FIG. 2), so that signal data may be transferred between the semiconductor chip of the button 10 and the interface circuit for performing one or more predefined tasks, e.g., authorizing access to a computer 20. The computer 20 housing includes a chassis 22 that contains the interface circuit and a substantially L-shaped, removable cover 24 to which the receptacle 18 is mounted in a front bezel-portion thereof. As will be described subsequently in detail, the receptacle 18 is electrically connected to the interface circuit within the chassis 22, the connection being made without wires extending between the cover 24 and the chassis so that the cover may be freely removed from, and replaced onto, the chassis.

Figure 2A:
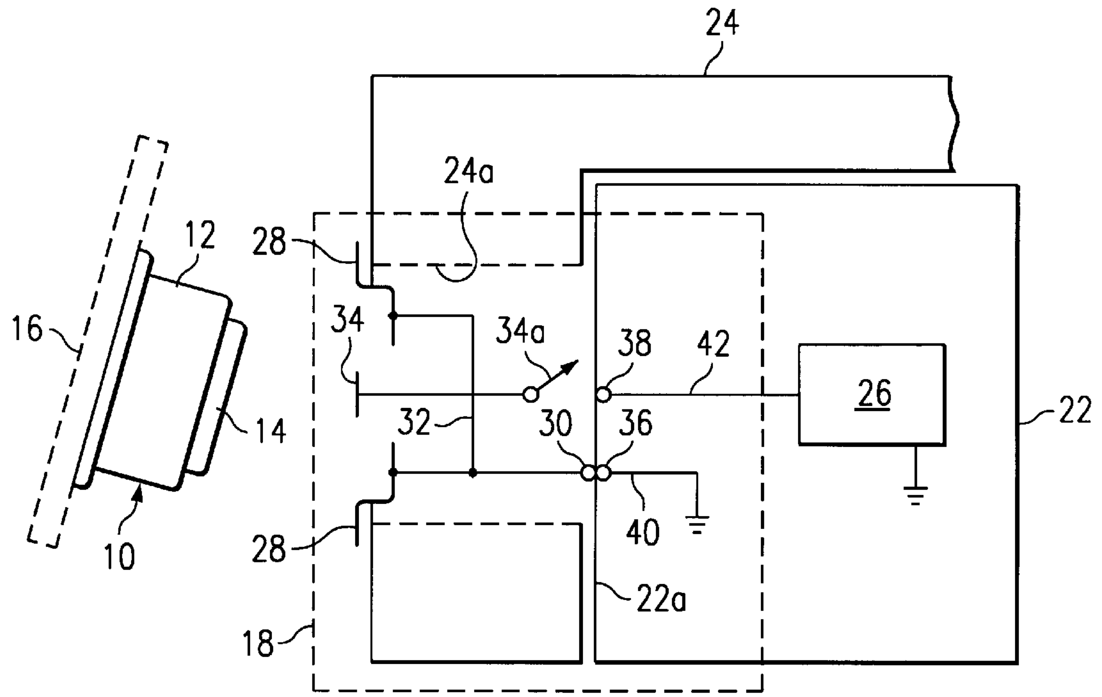
FIG. 2A is a schematic diagram of the electronic button receptacle of FIG. 1B showing the front bezel attached to the computer housing.
Figure 2B:
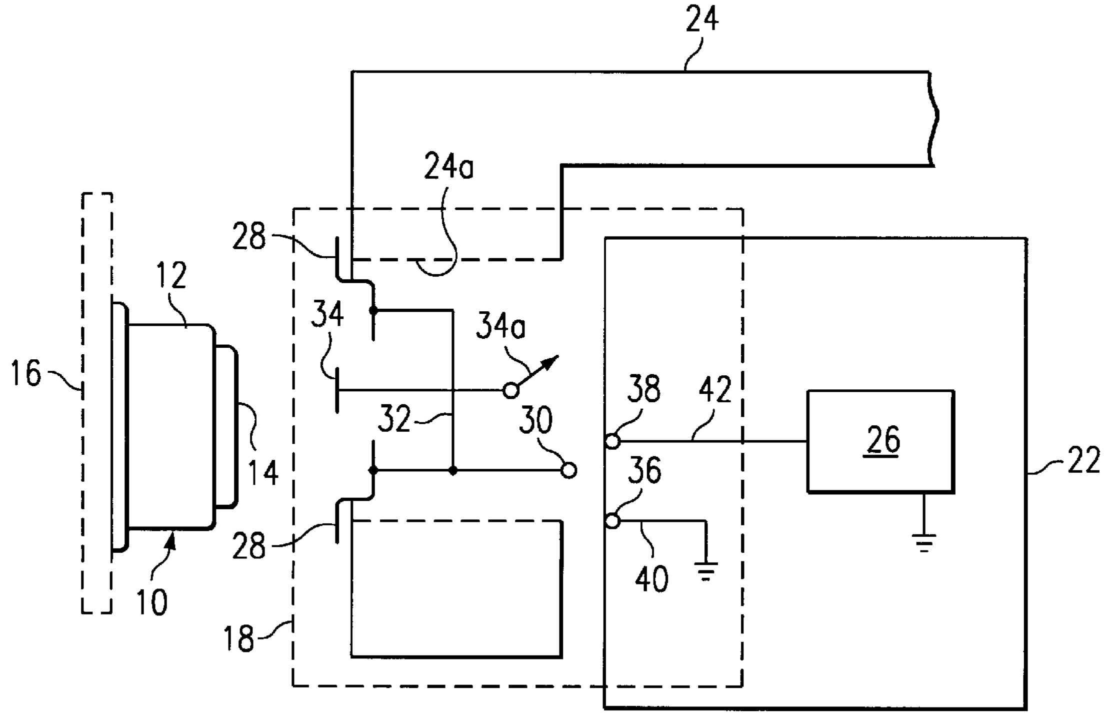
FIG. 2B is a schematic diagram of the electronic button receptacle of FIG. 1B showing the front bezel detached from the computer housing.

FIGS. 2A and 2B illustrate schematically the electrical connections between an interface circuit 26 within the chassis 22 and the receptacle 18. While not shown, it is understood the interface circuit 26 is connected to an appropriate power source and other circuitry as necessary within the chassis 22. It is understood that a generally circular aperture 24*a* is defined in the cover 24 as part of the receptacle 18 for receiving the button 10. A ground contact 28 (in the form of a circular collar in the illustrated embodiment) is supported in the periphery of the aperture 24*a*. A ground terminal 30 is electrically connected by a conductive element 32 to the ground contact 28. A signal contact 34, having a switch element 34*a* connected thereto, is supported by a column or other type of support structure (not shown) in the center of the aperture 24*a*.

Supported in a front wall 22*a* of the chassis 22 is a ground terminal 36 and a signal terminal 38. Conductive elements 40, 42 electrically connect, respectively, the ground terminal 36 to electrical ground and the signal terminal 38 to the interface circuit 26.

In operation, when the cover 24 is in its closed position over the chassis 22 (FIG. 2A), the terminals 36, 38 of the chassis are in alignment, respectively, with the ground terminal 30 and the switch element 34*a* of the cover. The ground terminal 30 of the cover 24 makes contact with the ground terminal 36 of the chassis 22 forming an electrical connection therebetween. When the button 10 is not yet received in the receptacle 18, the signal contact 34 remains un-depressed and thus the switch element 34*a* is in an open position, so that no electrical circuit can be completed through the signal contact 34 with the signal terminal 38 in the chassis 22. This prevents an accidental short circuit between the signal contact 34 and the ground contact 28, which might otherwise be caused by a conductive foreign object touching these contacts on the front of the receptacle 18.

When the button 10 is received in the receptacle 18, the female member 12 thereof makes electrical contact with the ground contact 28. The male member 14 of the button 10 depresses the signal contact 34, forcing the switch element 34*a* from its open position to a closed position. In the closed position, the switch element 34*a* makes electrical contact with the signal terminal 38 of the chassis 22, thereby completing the electrical circuit with the interface circuit 26. Specifically, the semiconductor chip (not shown) within the button 10 is electrically connected to the interface circuit 26 for transfer of data therebetween. When the button 10 is removed from the receptacle 18, the signal contact releases to its un-depressed position and the switch element 34*a* releases to an open position, wherein there is no longer electrical contact with the signal terminal 38 of the chassis 22.

FIG. 2B shows the cover 24 in an open position relative to the chassis 22. In the open position, the ground and signal terminals 36, 38 of the chassis 22 are no longer in electrical contact with the respective ground terminal 30 and switch element 34*a*. The cover 24 may be removed without breaking any hardwired connections between the cover 24 and the chassis 22. When the cover 24 is replaced to its closed position relative to the chassis, the above-described connections are re-established so that when the button 10 is received in the receptacle 18, an electrical circuit is completed between the button and the interface circuit 26.

Figure 3:
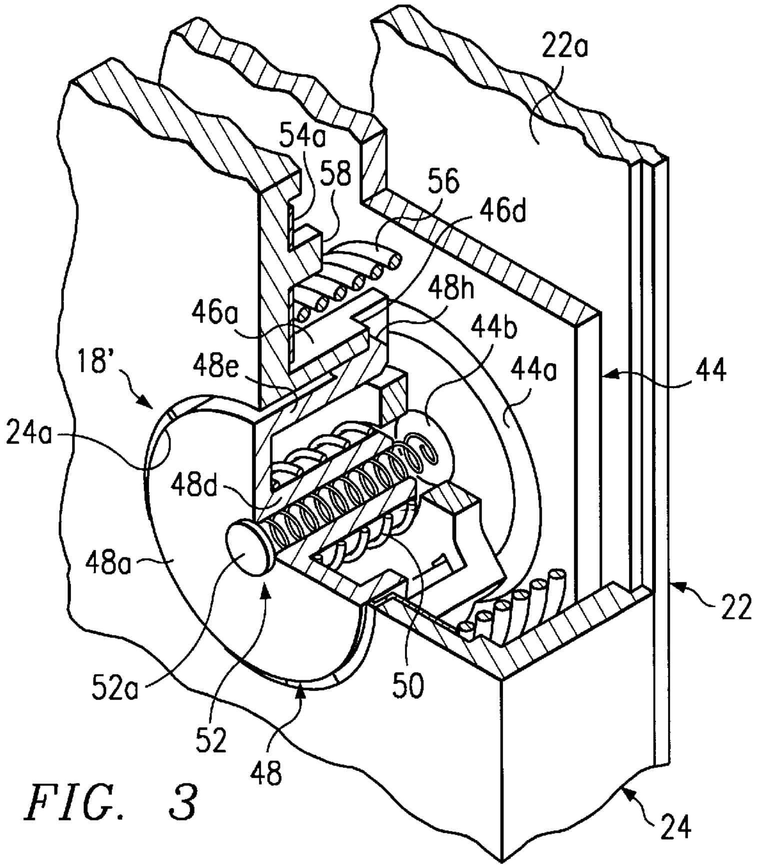
FIG. 3 is an enlarged, cut-away, front perspective view of the electronic button receptacle and a portion of the computer housing of FIG. 1B.
Figure 4:
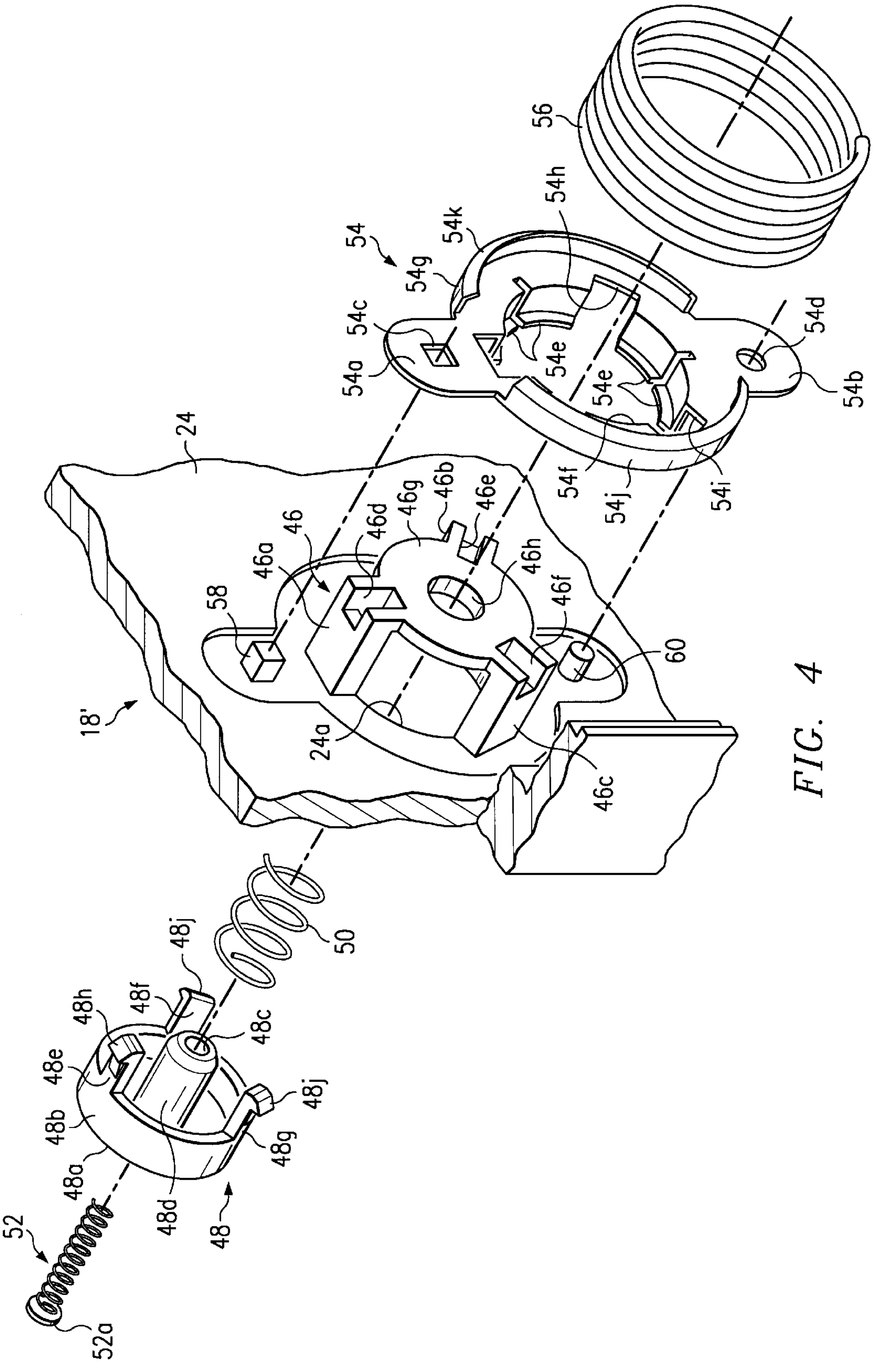
FIG. 4 is a cut away, exploded rear perspective view of the electronic button receptacle and a portion of the computer housing of FIG. 3.
Figure 5:
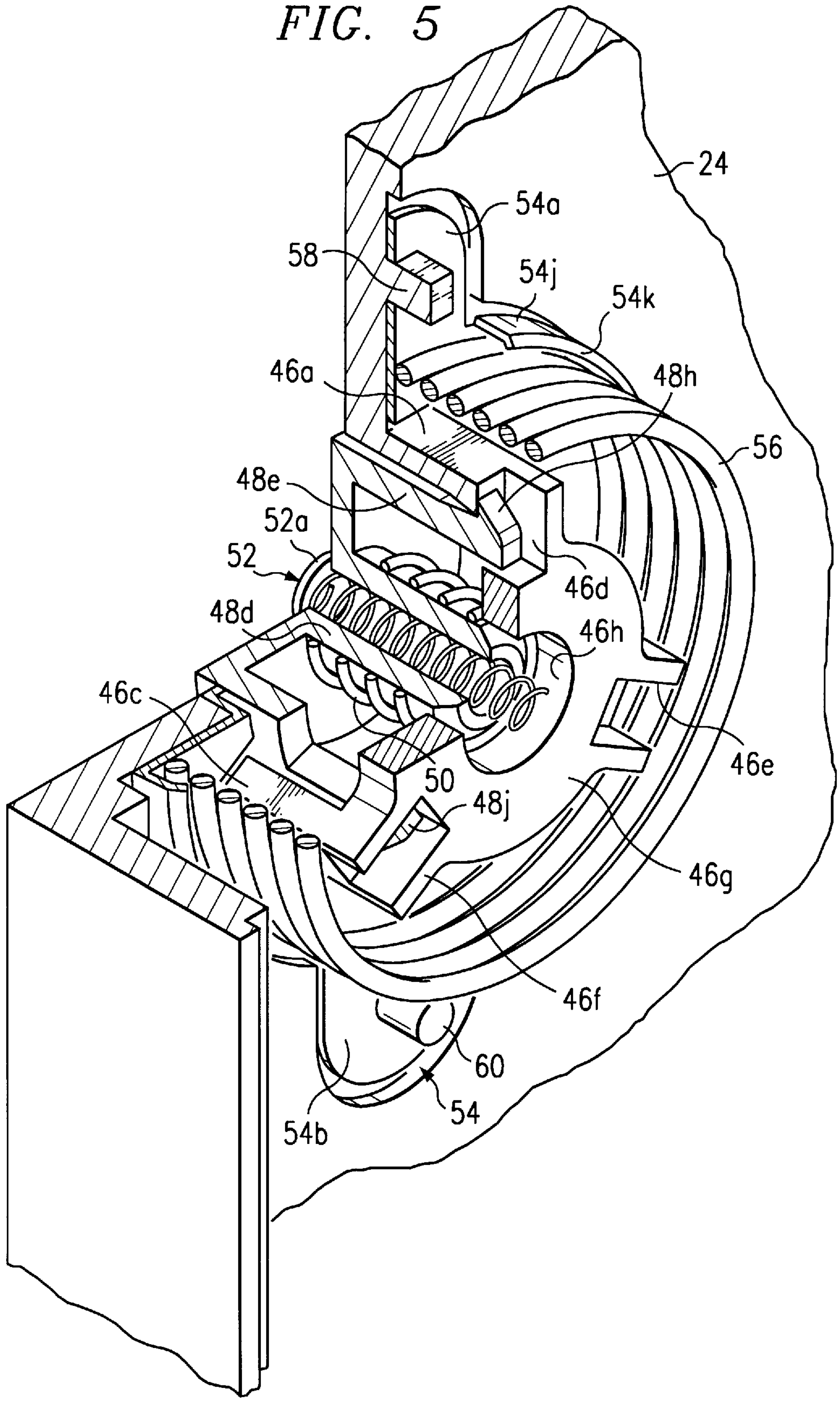
FIG. 5 is an enlarged, cut-away, rear perspective view of the electronic button receptacle and a portion of the computer housing of FIG. 3.

In FIGS. 3–5 a receptacle 18' is illustrated that represents one embodiment of the receptacle 18 for structurally supporting components thereof within the chassis 22 and the cover 24 of the computer 20.

Referring to FIG. 3, a printed circuit board 44 of the receptacle 18' is secured in a suitable fashion (not shown) to the front wall 22*a* of the chassis 22. A conductive signal pad 44*b* and a conductive ground pad 44*a* circumscribing the signal pad 44*b*, are etched into the board 40 or are otherwise secured thereto. While not shown, it is understood the pads 44*b*, 44*a* are connected by conductive elements to the interface circuit 26 (FIGS. 2A, 2B) and electrical ground, respectively. It is further understood the pads 44*b*, 44*a* correspond in function to the signal terminal 38 and the ground terminal 36, respectively, mounted to the front wall 22*a* and described previously with respect to FIGS. 2A, 2B. Moreover, it is contemplated that the interface circuit 26 (FIGS. 2A, 2B) may reside on the board 44, which is then electrically connected to other portions of the computer 20, such as a central processing unit (not shown).

Referring also to FIGS. 4–5, components of the receptacle 18' comprising part of the cover 24 include a pedestal 46 secured to a back of the cover over the aperture 24*a*. The pedestal 46 may be molded into the cover 24 as shown, or may be attached to the cover in any known manner. The pedestal 46 has an open, cylindrical body that defines three posts or stands 46*a*, 46*b* and 46*c* about its outer circumference. The stands 46*a*, 46*b* and 46*c* each define a slot 46*d*, 46*e* and 46*f*, respectively, for reasons to be described below. An end, or floor 46*g*, of the pedestal 46 defines a circular aperture 46*h* in the center of the floor, for reasons to be described.

A cylindrical column 48 is received in the cylindrical body of the pedestal 46 from an outer side of the cover 24 through the aperture 24*a*. As described further below, the column 48 is configured to slide back and forth within the cylindrical body of the pedestal 46 and a spring 50 loads the column in an extended position so that a face 48*a* of the column is normally even with the surface of the cover 24 around the aperture 24*a*. The column 48 defines a cylindrical wall 48*b*. A hole 48*c*, located within the center of the face 48*a*, extends through a shaft 48*d* secured to the back side of the face. The shaft 48*d* may be molded into the column 48 as shown, or attached in any known manner. The shaft 48*d* is sized to pass through the circular aperture 46*h* of the pedestal floor 46*g*, for a use to be described. Three legs 48*e*, 48*f* and 48*g* extend from the cylindrical wall 48*b* along a central axis of the column 48. Snap tabs 48*h*, 48*i* and 48*j* are located at the ends of each of the legs 48*e*, 48*f*, 48*g*, respectively. The legs 48*e*, 48*f* and 48*g* are sized and located on the column 48 to pass through the slots 46*d*, 46*e* and 46*f*, respectively, in the pedestal 46 as best shown in FIG. 5. Further, the snap tabs 48*h*, 48*i* and 48*j* of the column 48 are designed to pass through slots 46*d*, 46*e* and 46*f*, respectively, and to engage the pedestal stands 46*a*–46*c* to restrict the column's removal from the pedestal 46. The snap tabs 48*h*, 48*i* and 48*j* allow the spring 50 to bias the column 48 at a distance in full extension that is exactly flush with the surface of the cover 24, as shown in FIG. 3.

The spring 50 is placed around the shaft 48*d* of the column 48 and contacts the back of column face 48*a* and the pedestal floor 46*g*. As explained further below, when the button 10 engages the face 48*a* and is received into the aperture 24*a*, the column 48 slides against the force of the spring 50 into pedestal 46.

A signal spring 52 extends into the hole 48*c* and through the shaft 48*d* of the column 48. A head 52*a* of the spring 52 serves as an electrical signal contact for the male member 14 of the button 10. It is understood the spring 52 serves the same function as the signal terminal 34 and switch element 34*a* of the receptacle 18 described previously with reference to FIGS. 2A, 2B.

As shown in FIGS. 3 and 5, the head 52*a* is secured to the cylindrical column 48 such that the head 52*a* is flush with the column face 48*a* proximate the column hole 48*c*, with the spring 52 passing through the column shaft 48*d*. As described further below, when the column 48 is depressed within the pedestal 46 by the button 10, the spring 52 engages the signal pad 44*b*, thereby completing the electrical circuit between the button and the interface circuit 26.

Referring to FIG. 4, a substantially circular ground plate 54 fits over and is secured to the pedestal 46 on the rear side of the cover 24. The plate 54 defines tabs 54*a* and 54*b* extending therefrom. A square aperture 54*c* is defined within the tab 54*a* and a round aperture 54*d* is defined within tab 54*b*. The square aperture 54*c* and the round aperture 54*d* are used to locate and secure the ground plate 54 to the back of the cover 24 proximate the aperture 24*a*. Extending from the front center of the ground plate 54 are a plurality of fingers 54*e*, or electrical contacts. It is understood the fingers 54*e* serve the same function as the ground contact 28 in the receptacle 18, as described previously with reference to FIGS. 2A, 2B.

The fingers 54*e* define a circular opening 54*f* in the center of the ground plate 54. Three notches 54*g*, 54*h* and 54*i* are defined in the ground plate 54 around the opening 54*f* such that the ground plate 54 may be inserted over the pedestal 46 and placed flush with the back of the cover 24. The notches 54*g*, 54*h* and 54*i* are located and sized to allow the stands 46*a*, 46*b* and 46*c*, respectively, to pass through the ground plate 54. When the ground plate 54 is placed flush with the back of the cover 24, the fingers 54*e* extend between the edge of aperture 24*a* in the cover 24 and the wall 48*b* of column 48 so that the fingers 54*e* can serve as an electrical ground contact for engaging the female member 12 of the button 10, when the button is inserted in the aperture 24*a*.

A circular wall 54*j* circumscribes and defines the periphery of the ground plate 54. A lip 54*k* is defined around the end of the wall 54*j*. The lip 54*k* is designed to receive and secure, in an electrically conductive manner, one end of a ground spring 56. It is understood that the ground spring 56 performs the same function as the ground terminal 30 of the receptacle 18 described previously with respect to FIGS. 2A, 2B. The ground spring 56 is aligned with, and is biased against, the ground pad 44*a* on the board 44 for electrical connection therewith. Compression of the ground spring 56 between the ground plate 54 and the board 44 ensures a good electrical connection between the spring and the ground pad 44*a*.

A square peg 58 and a round peg 60 extending from the rear side of the cover 24 secure the ground plate 54 and hence the ground spring 56 to the rear of the cover proximate the aperture 24*a*. The square peg 58 and round peg 60 are constructed to fit within the square aperture 54*c* and round aperture 54*d*, respectively, of the ground plate 54. After the square peg 58 has been inserted into the square aperture 54*c*, and the round peg 60 has been inserted into the round aperture 54*d*, such that the ground plate 54 is flush with the rear of the cover 24, both the pegs 58, 60 may be bent or melted over ground plate 54 to secure the ground plate to the cover. By utilizing the square peg 58—round peg 60 combination, the ground plate 54 may only be inserted onto the back of the cover 24 in the proper orientation.

In operation, the receptacle 18' operates in a manner similar to that described with reference to the receptacle 18 of FIGS. 2A, 2B. When the cover 24 is in its closed position relative to the chassis 22, the ground spring 56 of the cover 24 is in electrical contact with the ground pad 44*a* of the board 44. The signal spring 52 is aligned with the ground pad 44*b*, but is not in electrical contact with it because the column 48 has not been compressed by the button 10.

Before the button 10 is received in the aperture 24*a*, the column face 48*a* is flush with the front surface of the cover 24 because the column 48 is biased by the spring 50 outwardly from the cover, to the limits of the tabs 48*h*, 48*i*, 48*j* engaging the pedestal slots 46*d*, 46*e*, 46*f*. The signal spring 52 extends within the column shaft 48*d*, but does not make contact with the signal pad 44*a*, so there accordingly is no completion of an electrical circuit with the interface circuit 26. Thus any foreign objects creating a conductive contact between the signal spring head 52*a* and the legs 54*e* of the ground plate 54 cannot cause a short circuit of the interface circuit 26.

When the button 10 is inserted in the aperture 24*a*, the male member 14 thereof engages the column face 48*a* and makes electrical contact with the signal spring head 52*a*. As the button 10 is depressed, the column 48 slides within the body of the pedestal 46 into the cover 24, guided by the legs 48*e*, 48*f*, 48*g*, to the limit of the floor 46*g*. The female member 12 of the button 10 engages and makes electrical contact with the ground plate fingers 54*e*. An electrical connection to ground is thus completed between the semiconductor chip (not shown) within the button 10, the female member 12, the fingers 54*e*, the ground spring 56, the ground pad 44*a*, and electrical ground.

Further, as the button 10 is depressed, the signal spring 52 supported within the column shaft 48*d* engages the signal pad 44*b* of the board 44. An electrical signal connection is thus made between the semiconductor chip (not shown) within the button 10, the male member 14, the signal spring 52, the signal pad 44*b*, and the interface circuit 26. As the button 10 is depressed against the force of the spring 50 to the limit of the floor 46*g* and then released slightly against the force of the spring 50, it is possible that the electrical connection will be a momentary connection. A momentary connection in some embodiments is sufficient to perform the data transfer operation between the button 10 and the interface circuit 26, although a non-momentary connection is also possible and contemplated by the present invention. The button 10 may remain in the aperture 24*a* or be removed.

The cover 24 may be removed from the chassis 22 and then later replaced, wherein the electrical connections of the receptacle 18' between the cover and the chassis are then reestablished. When the cover 24 is removed from the chassis 22, the ground spring 56 disengages its contact with the ground pad 44*b* and the signal spring 52 is no longer in alignment with the signal pad 44*a*. The cover may be completely disassociated from the chassis because there are no wires interconnecting them. The cover 24 may then be replaced to its closed position relative to the chassis 22, whereupon the ground spring 56 engages, and becomes biased against, the ground pad 44*b* and whereupon the signal spring 52 is in alignment with the signal pad 44*a*, for possible activation by depressing the button 10 into the aperture 24*a*, as described above.

Several advantages result from use of the present invention. In the manufacture and assembly of the computer 20 a significant degree of variation exists in chassis 22 and cover 24 construction, particularly with regard to the distance of separation therebetween when the cover 24 is closed. The use of signal spring 52 and ground spring 56 to contact the pads 44*b*, 44*a*, respectively, thus allow for this variation in separation. Accordingly, the receptacle of the present invention enables existing computer housing manufacturing techniques to be used successfully in a computer equipped with electronic button capabilities. Further, the use of the signal spring 52 and ground spring 56 to create the electrical connection with the board 44 removes the need for a fly-wire to connect the receptacle to the interface circuit, enabling the cover 24 to be easily removed from the chassis 22. Also, because the signal spring 52 is not constantly in contact with the signal pad 44*a*, the risk of inadvertent contact external contacts with the receptacle causing short circuits is minimized.

Additionally, since the ground spring 56 is in contact with the ground pad 44*b* when the cover 24 is secured to the chassis 22, the ground pad 44*b* could be used to indicate when the cover 24 has been removed from the chassis 22 by sensing when the ground spring 56 disengages the ground pad 44*b*. This could be accomplished by utilizing a pressure sensitive ground pad 44*b*, by forming an electrical circuit through the ground spring 56 and the ground pad 44*b*, or any other appropriate method.

Although an illustrative embodiment of the invention has been shown and described, other modifications, changes, and substitutions are intended in the foregoing disclosure. For example, the electronic button receptacle need not be placed in a computer 20 but could be placed in any other enclosure. The pedestal 46 could have any shape with any number of stands and the column 48 could have any number of legs. The shaft 48*d* in the column need not pass through the aperture 46*h*. The signal pad 44*a* and ground pad 44*b* need not be circular or arranged one within the other. The signal spring 52 and ground spring 56 may be of any shape as long as they allow connection to associated signal and ground connections. The ground plate could take on any shape as long as the female member 12 of the electronic button 10 contacts an electrical ground when inserted in the electronic button receptacle. Similarly, the signal spring 52 could take on any shape or be located in any position as long as the male member 14 of the electronic button 10 contacts a signal connection when inserted in the electronic button receptacle.

Further, in certain applications there may be no need to separate components of the receptacle between the cover 24 and the chassis 22. Accordingly, the pedestal could be directly connected to the printed circuit board, or other electrical device with a signal pad, and the ground plate could be directly wired to ground. Accordingly, it is appropriate that the appended claims be construed broadly and in a manner consistent with the scope of the invention.

What is claimed is:

1. Receptacle apparatus for completing an electrical circuit between first and second devices, comprising:

a column movable within a structure defining a channel having first and second ends, said column including an electrically conductive contact engageable by said first device at said first channel end;

an electrical terminal spaced from said column at said second channel end, said terminal being electrically connectable to said second device; and a connector electrically connected to said contact and extending within said channel toward said terminal, such that upon engagement of said contact by said first device, said connector electrically engages said terminal, thereby completing said electrical circuit between said devices.

2. The apparatus of claim 1 wherein said first device is an electronic button.

3. The apparatus of claim 1 wherein said second device is a computer interface circuit.

4. The apparatus of claim 1 wherein said electrical connector is an electrically conductive spring.

5. The apparatus of claim 4 wherein said column further comprises a shaft extending toward said terminal, said spring disposed within said shaft.

6. The apparatus of claim 1 further comprising a second electrically conductive contact engageable by said first device, said second contact located within said channel adjacent said column.

7. The apparatus of claim 6 further comprising a second terminal spaced from said column at said second channel end, said second terminal being electrically connectable to said second device, said second terminal further being connectable to said second electrically conductive contact by ground spring means.

8. The apparatus of claim 7 wherein said second terminal is a contact sensitive terminal capable of detecting contact by the ground spring means.

9. Receptacle apparatus comprising:

a housing having cooperating first and second components, said first component having a channel defined therein;

a column moveable within said channel, said column having an engageable electrically conductive contact;

an electrical pad secured to said second component proximate said channel; and an electrical connector electrically connected to said contact and extending within said channel toward said pad, wherein upon engagement of said column, said connector electrically engages said pad.

10. The apparatus of claim 9, wherein said housing is a computer housing, said first component being a cover and said second component being a chassis.

11. The apparatus of claim 9, further comprising a pedestal secured to said first component proximal to said channel, said column being movably attached to said pedestal.

12. The apparatus of claim 11, wherein said pedestal has at least one slot therein, and said column has at least one leg with an attached snap tab to engage said pedestal through said slot.

13. The apparatus of claim 11, wherein a bias spring is disposed between said pedestal and said column.

14. The apparatus of claim 9 wherein said electrical connector is an electrically conductive spring.

15. An information transfer device comprising:

an information storage device;

a column moveable within a channel, said column having a first engageable electrically conductive contact;

a second engageable electrically conductive contact adjacent from said channel;

a first electrical pad spaced from said column within said channel and a second electrical pad spaced from said column;

a first electrical connector electrically connected to said first contact and extending within said channel toward said first pad, wherein upon engagement of said column, said first connector electrically engages said first pad; and a second electrical connector electrically connected to said second contact and said second pad, wherein upon engaging said column with said information storage device and moving said column within said channel, said information storage device contacts said first and second contacts, completing an electrical circuit therethrough for the transfer of information.

16. The apparatus of claim 15 wherein said information storage device comprises an electronic button having a first and a second member, said first member for engaging said first contact and said second member for engaging said second contact.

17. The apparatus of claim 15 wherein said first electrical pad is electrically connected to electrical circuitry to control the transfer of information with said information storage device, and said second electrical pad is electrically connected to ground.

18. The apparatus of claim 15 wherein said second pad is a contact sensitive pad capable of detecting contact by the second electrical connector.

19. Receptacle apparatus for completing an electrical circuit between first and second devices, comprising:

means movable within a structure defining a channel having first and second ends, said moving means including an electrically conductive contact engageable by said first device at said first channel end;

an electrical terminal spaced from said column at said second channel end, said terminal being electrically connectable to said second device; and connector means electrically connected to said contact and extending within said channel toward said terminal, such that upon engagement of said contact by said first device, said connector means electrically engages said terminal, thereby completing said electrical circuit between said devices.

20. The apparatus of claim 19 wherein said first device is an electronic button.

21. The apparatus of claim 19 wherein said second device is a computer interface circuit.

22. The apparatus of claim 19 wherein said electrical connector means is an electrically conductive spring.

23. The apparatus of claim 22 wherein said movable means further comprises a shaft extending toward said terminal, said spring disposed within said shaft.

24. Receptacle apparatus for completing an electrical circuit between first and second devices, said receptacle apparatus being part of first and second structures that are movable relative to one another between proximal and separated positions, comprising:

a column movable within a channel defined in said first structure, said channel having first and second ends, said column including a first electrically conductive contact engageable by said first device at said first channel end;

a second electrically conductive contact in said channel engageable by said first device at said first channel end;

first and second electrical terminals spaced from said column at said second channel end, said terminals supported in said second structure and being electrically connectable to said second device;

conductive spring means electrically connected to said second contact, said spring means being compressed against said second terminal when said first and second structures are in their proximal position, thereby electrically connecting said second contact and said second terminal; and a connector electrically connected to said first contact and extending within said channel toward said first terminal, such that upon engagement of said first contact by said first device, said connector electrically engages said first terminal when said first and second structures are in their proximal position, thereby completing said electrical circuit between said devices.

* * * * *

UNITED STATES PATENT AND TRADEMARK OFFICE

CERTIFICATE OF CORRECTION

PATENT NO. : 5,862,071 
DATED : January 19, 1999
INVENTOR(S) : Erica Scholder

It is certified that error appears in the above-identified patent and that said Letters Patent is hereby corrected as shown below:

Title page,
Item [54], after "RECEPTACLE FOR", delete "TOUCH MEMORY", and insert -- ELECTRONIC --.

Signed and Sealed this

Twenty-fifth Day of June, 2002

*Attest:*

JAMES E. ROGAN

*Attesting Officer* *Director of the United States Patent and Trademark Office*